(12) United States Patent
Jang et al.

(10) Patent No.: US 9,653,573 B2
(45) Date of Patent: May 16, 2017

(54) REPLACEMENT METAL GATE INCLUDING DIELECTRIC GATE MATERIAL

(71) Applicants: International Business Machines Corporation, Armonk, NY (US); GLOBALFOUNDRIES Inc., Grand Cayman (KY)

(72) Inventors: Linus Jang, Clifton Park, NY (US); Sivananda K. Kanakasabapathy, Niskayuna, NY (US); Sanjay C. Mehta, Niskayuna, NY (US); Soon-Cheon Seo, Glenmont, NY (US); Raghavasimhan Sreenivasan, Schenectady, NY (US)

(73) Assignees: INTERNATIONAL BUSINESS MACHINES CORPORATION, Armonk, NY (US); GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/827,510

(22) Filed: Aug. 17, 2015

(65) Prior Publication Data

US 2015/0357434 A1    Dec. 10, 2015

Related U.S. Application Data

(62) Division of application No. 14/168,112, filed on Jan. 30, 2014.

(51) Int. Cl.
*H01L 29/66* (2006.01)
*H01L 21/8234* (2006.01)
(Continued)

(52) U.S. Cl.
CPC ...... *H01L 29/66545* (2013.01); *H01L 21/283* (2013.01); *H01L 21/3065* (2013.01);
(Continued)

(58) Field of Classification Search
CPC ..... H01L 21/823431; H01L 21/823437; H01L 21/823468; H01L 29/66545
See application file for complete search history.

(56) References Cited

U.S. PATENT DOCUMENTS 5,736,446 A * 4/1998 Wu .................... H01L 21/2254
                                                        257/E21.148
5,739,573 A * 4/1998 Kawaguchi ....... H01L 21/82344
                                                        257/368
(Continued)

OTHER PUBLICATIONS

Applied Materials' New Carina System Overcomes Barriers To Etching High-K/Metal Gates, 2007, retrieved from website: appliedmaterials.com/company/news/press-releases/2007/07/applied-materials-new-carina-system-overcomes-barriers-to-etching-high-kmetal-gates.*

(Continued)

*Primary Examiner* — Bac Au
*Assistant Examiner* — Sophia Nguyen
(74) *Attorney, Agent, or Firm* — Cantor Colburn LLP; Steven Meyers

(57) ABSTRACT

A method of fabricating a semiconductor device includes forming at least one semiconductor fin on a semiconductor substrate. A plurality of gate formation layers is formed on an etch stop layer disposed on the fin. The plurality of gate formation layers include a dummy gate layer formed from a dielectric material. The plurality of gate formation layers is patterned to form a plurality of dummy gate elements on the etch stop layer. Each dummy gate element is formed from the dielectric material. A spacer layer formed on the dummy gate elements is etched to form a spacer on each sidewall of dummy gate elements. A portion of the etch stop layer located between each dummy gate element is etched to expose a portion the semiconductor fin. A semiconductor (Continued)

material is epitaxially grown from the exposed portion of the semiconductor fin to form source/drain regions.

1 Claim, 21 Drawing Sheets

(51) Int. Cl.
H01L 21/283 (2006.01)
H01L 21/3065 (2006.01)
H01L 21/311 (2006.01)

(52) U.S. Cl.
CPC ............... *H01L 21/31144* (2013.01); *H01L 21/823431* (2013.01); *H01L 21/823437* (2013.01); *H01L 21/823468* (2013.01); *H01L 29/6656* (2013.01); *H01L 29/66795* (2013.01)

(56) References Cited

U.S. PATENT DOCUMENTS

| | | | |
|---|---|---|---|
| 6,054,355 A * | 4/2000 | Inumiya | H01L 21/28114 257/E21.205 |
| 6,291,282 B1 | 9/2001 | Wilk et al. | |
| 6,376,347 B1 | 4/2002 | Ohmura | |
| 6,451,639 B1 * | 9/2002 | Jang | H01L 21/82384 257/E21.637 |
| 6,664,154 B1 | 12/2003 | Bell | |
| 6,664,592 B2 * | 12/2003 | Inumiya | H01L 21/28114 257/244 |
| 6,667,199 B2 * | 12/2003 | Torii | H01L 21/82342 257/E21.444 |
| 6,812,535 B2 * | 11/2004 | Yagishita | H01L 21/76801 257/213 |
| 7,033,869 B1 | 4/2006 | Xiang | |
| 7,585,716 B2 * | 9/2009 | Cheng | H01L 29/42368 257/E21.453 |
| 7,812,411 B2 * | 10/2010 | Cheng | H01L 29/42368 257/386 |
| 7,859,053 B2 * | 12/2010 | Chang | H01L 21/845 257/270 |
| 7,902,058 B2 | 3/2011 | Datta et al. | |
| 7,928,427 B1 | 4/2011 | Chang | |
| 8,053,323 B1 | 11/2011 | Lin et al. | |
| 8,148,218 B2 | 4/2012 | Chang | |
| 8,264,021 B2 | 9/2012 | Lai et al. | |
| 8,329,546 B2 * | 12/2012 | Lee | H01L 21/28114 257/E21.19 |
| 8,445,345 B2 | 5/2013 | Cheng et al. | |
| 8,524,592 B1 * | 9/2013 | Xie | H01L 29/78 257/387 |
| 8,535,998 B2 * | 9/2013 | Hing | H01L 29/6653 257/E21.444 |
| 8,536,040 B1 * | 9/2013 | Park | H01L 29/49 257/E21.198 |
| 8,580,634 B1 * | 11/2013 | Xie | H01L 21/845 257/E21.635 |
| 8,674,470 B1 | 3/2014 | Or-Bach et al. | |
| 8,796,093 B1 * | 8/2014 | Cheng | H01L 29/66545 257/327 |
| 8,927,350 B2 | 1/2015 | Zheng | |
| 8,952,459 B2 * | 2/2015 | Hing | H01L 29/6653 257/368 |
| 9,034,700 B1 | 5/2015 | Jeong et al. | |
| 9,064,890 B1 * | 6/2015 | Xie | H01L 21/82343 |
| 9,093,302 B2 * | 7/2015 | Xie | H01L 27/0886 |
| 9,112,032 B1 * | 8/2015 | Liu | H01L 29/66795 |
| 9,318,367 B2 * | 4/2016 | Huang | H01L 21/76224 |
| 9,318,388 B2 * | 4/2016 | Xie | H01L 21/82343 |
| 9,356,121 B2 | 5/2016 | Jagannathan et al. | |
| 9,362,181 B1 * | 6/2016 | Xie | H01L 21/82387 |
| 9,362,405 B1 * | 6/2016 | Jacob | H01L 29/7851 |
| 9,450,095 B1 * | 9/2016 | Bergendahl | H01L 29/7848 |
| 2001/0023120 A1 * | 9/2001 | Tsunashima | H01L 21/28088 438/585 |
| 2003/0022422 A1 * | 1/2003 | Torii | H01L 21/82342 438/183 |
| 2004/0259297 A1 * | 12/2004 | Inumiya | H01L 21/28185 438/183 |
| 2007/0037342 A1 * | 2/2007 | Mehrad | H01L 21/28097 438/230 |
| 2007/0045752 A1 | 3/2007 | Forbes et al. | |
| 2007/0145487 A1 | 6/2007 | Kavalieros et al. | |
| 2007/0152266 A1 | 7/2007 | Doyle et al. | |
| 2008/0057690 A1 | 3/2008 | Forbes et al. | |
| 2008/0121962 A1 | 5/2008 | Forbes et al. | |
| 2008/0124907 A1 | 5/2008 | Forbes et al. | |
| 2008/0124908 A1 | 5/2008 | Forbes et al. | |
| 2008/0173947 A1 * | 7/2008 | Hou | H01L 21/82383 257/369 |
| 2008/0237663 A1 * | 10/2008 | Hanafi | H01L 29/105 257/289 |
| 2009/0026540 A1 | 1/2009 | Sasaki et al. | |
| 2009/0206416 A1 * | 8/2009 | Cheng | H01L 21/82384 257/369 |
| 2010/0006945 A1 * | 1/2010 | Merelle | H01L 21/82341 257/368 |
| 2010/0181620 A1 * | 7/2010 | Booth, Jr. | H01L 21/28282 257/350 |
| 2011/0033803 A1 | 2/2011 | Hatakeyama et al. | |
| 2011/0068407 A1 * | 3/2011 | Yeh | H01L 21/82380 257/369 |
| 2011/0147812 A1 | 6/2011 | Steigerwald et al. | |
| 2011/0233679 A1 * | 9/2011 | Chen | H01L 21/82343 257/368 |
| 2011/0237046 A1 * | 9/2011 | Maszara | H01L 29/66795 438/424 |
| 2012/0003806 A1 * | 1/2012 | Wang | H01L 29/66545 438/305 |
| 2012/0061738 A1 | 3/2012 | Yin et al. | |
| 2012/0104498 A1 * | 5/2012 | Majumdar | H01L 29/66545 257/351 |
| 2012/0112248 A1 * | 5/2012 | Wu | H01L 21/2236 257/255 |
| 2012/0193713 A1 * | 8/2012 | Kulkarni | H01L 29/41791 257/347 |
| 2012/0248508 A1 | 10/2012 | Ponoth et al. | |
| 2013/0017680 A1 | 1/2013 | Haran et al. | |
| 2013/0043515 A1 | 2/2013 | Huang et al. | |
| 2013/0043535 A1 | 2/2013 | Anderson et al. | |
| 2013/0049128 A1 | 2/2013 | Scheiper et al. | |
| 2013/0049142 A1 * | 2/2013 | Liu | H01L 29/4983 257/412 |
| 2013/0062702 A1 | 3/2013 | Cheng et al. | |
| 2013/0078772 A1 * | 3/2013 | Yuan | H01L 29/66803 438/163 |
| 2013/0078788 A1 | 3/2013 | Suguro | |
| 2013/0113027 A1 | 5/2013 | Chiang et al. | |
| 2013/0164924 A1 * | 6/2013 | Shieh | H01L 29/7855 438/586 |
| 2013/0187228 A1 * | 7/2013 | Xie | H01L 29/785 257/347 |
| 2013/0189833 A1 | 7/2013 | Baars et al. | |
| 2013/0217190 A1 | 8/2013 | Jagannathan et al. | |
| 2013/0221413 A1 | 8/2013 | Jagannathan et al. | |
| 2013/0228876 A1 * | 9/2013 | Mor | H01L 29/66545 257/401 |
| 2013/0270638 A1 | 10/2013 | Adam et al. | |
| 2013/0273702 A1 | 10/2013 | Zheng | |
| 2013/0292746 A1 * | 11/2013 | Jagannathan | F04B 19/006 257/288 |
| 2013/0292835 A1 | 11/2013 | King et al. | |
| 2013/0299920 A1 * | 11/2013 | Yin | H01L 29/78 257/408 |
| 2013/0299922 A1 | 11/2013 | Choi et al. | |
| 2013/0309852 A1 | 11/2013 | Kanakasabapathy et al. | |
| 2013/0320449 A1 * | 12/2013 | Hoentschel | H01L 21/82380 257/368 |
| 2013/0328111 A1 | 12/2013 | Xie et al. | |
| 2014/0001575 A1 | 1/2014 | Adams et al. | |
| 2014/0021538 A1 | 1/2014 | Bangsaruntip et al. | |

(56) References Cited

U.S. PATENT DOCUMENTS

| | | | |
|---|---|---|---|
| 2014/0027816 A1* | 1/2014 | Cea | H01L 29/66545 257/192 |
| 2014/0027859 A1* | 1/2014 | Gerhardt | H01L 21/28202 257/392 |
| 2014/0054654 A1* | 2/2014 | Hsieh | H01L 29/78 257/288 |
| 2014/0070285 A1* | 3/2014 | Xie | H01L 29/66545 257/288 |
| 2014/0070328 A1 | 3/2014 | Goto et al. | |
| 2014/0084383 A1* | 3/2014 | Cai | H01L 29/66545 257/401 |
| 2014/0103403 A1 | 4/2014 | Kim et al. | |
| 2014/0110798 A1* | 4/2014 | Cai | H01L 29/78 257/410 |
| 2014/0117421 A1* | 5/2014 | Seo | H01L 21/82341 257/288 |
| 2014/0124840 A1* | 5/2014 | Khakifirooz | H01L 29/66545 257/288 |
| 2014/0124873 A1 | 5/2014 | Jagannathan et al. | |
| 2014/0145242 A1* | 5/2014 | Huang | H01L 21/82380 257/192 |
| 2014/0162447 A1 | 6/2014 | Edge et al. | |
| 2014/0183599 A1* | 7/2014 | Hong | H01L 29/785 257/190 |
| 2014/0191300 A1* | 7/2014 | Jhaveri | H01L 29/66795 257/288 |
| 2014/0203362 A1 | 7/2014 | Kim et al. | |
| 2014/0217508 A1 | 8/2014 | Chang et al. | |
| 2014/0217509 A1 | 8/2014 | Chang et al. | |
| 2014/0231924 A1 | 8/2014 | Kuo et al. | |
| 2014/0239354 A1 | 8/2014 | Huang et al. | |
| 2014/0239395 A1 | 8/2014 | Basker et al. | |
| 2014/0239404 A1* | 8/2014 | Huang | H01L 27/0924 257/369 |
| 2014/0264575 A1* | 9/2014 | Tsai | H01L 29/66492 257/336 |
| 2014/0264636 A1* | 9/2014 | Tsai | H01L 29/66636 257/408 |
| 2014/0273429 A1 | 9/2014 | Wei et al. | |
| 2014/0312398 A1* | 10/2014 | Ching | H01L 29/66795 257/288 |
| 2014/0327055 A1* | 11/2014 | Wang | H01L 29/4966 257/288 |
| 2014/0361352 A1 | 12/2014 | Hung et al. | |
| 2014/0377917 A1* | 12/2014 | He | H01L 27/0886 438/157 |
| 2015/0001468 A1* | 1/2015 | Huang | H01L 29/66977 257/24 |
| 2015/0001627 A1 | 1/2015 | Zang et al. | |
| 2015/0021683 A1 | 1/2015 | Xie et al. | |
| 2015/0044842 A1* | 2/2015 | Wang | H01L 29/665 438/296 |
| 2015/0054089 A1 | 2/2015 | Hong et al. | |
| 2015/0060960 A1* | 3/2015 | Xie | H01L 29/785 257/288 |
| 2015/0108544 A1* | 4/2015 | Ching | H01L 21/82382 257/192 |
| 2015/0115363 A1 | 4/2015 | Chang et al. | |
| 2015/0118836 A1 | 4/2015 | Lin | |
| 2015/0129962 A1* | 5/2015 | Xie | H01L 27/1211 257/347 |
| 2015/0129988 A1 | 5/2015 | Leobandung | |
| 2015/0147860 A1 | 5/2015 | Kim | |
| 2015/0162445 A1* | 6/2015 | Wu | H01L 29/7848 257/344 |
| 2015/0171216 A1 | 6/2015 | Xie et al. | |
| 2015/0200267 A1 | 7/2015 | Chig et al. | |
| 2015/0200271 A1 | 7/2015 | Lee et al. | |
| 2015/0228780 A1* | 8/2015 | Cheng | H01L 29/785 257/401 |
| 2015/0236123 A1 | 8/2015 | Chang et al. | |
| 2015/0263122 A1* | 9/2015 | Hsiao | H01L 29/515 257/401 |
| 2015/0333072 A1* | 11/2015 | Li | H01L 27/112 365/182 |
| 2015/0364578 A1* | 12/2015 | Liu | H01L 29/66795 257/401 |
| 2015/0364595 A1* | 12/2015 | Liu | H01L 29/66795 257/401 |
| 2016/0071952 A1* | 3/2016 | Yin | H01L 29/66795 438/283 |
| 2016/0079124 A1* | 3/2016 | Yin | H01L 21/82343 438/283 |
| 2016/0099150 A1* | 4/2016 | Tsai | H01L 21/2252 257/401 |
| 2016/0181395 A1* | 6/2016 | Liu | H01L 29/66545 257/347 |
| 2016/0240651 A1* | 8/2016 | Lee | H01L 29/785 |

OTHER PUBLICATIONS

Zengfeng et al., "Thermal stability of diamondlike carbon buried layer fabricated by plasma immersion ion implantation and deposition in silicon on insulator", Journal of Applied Physics, 98, 053502-1, 2005, pp. 1-5.

* cited by examiner

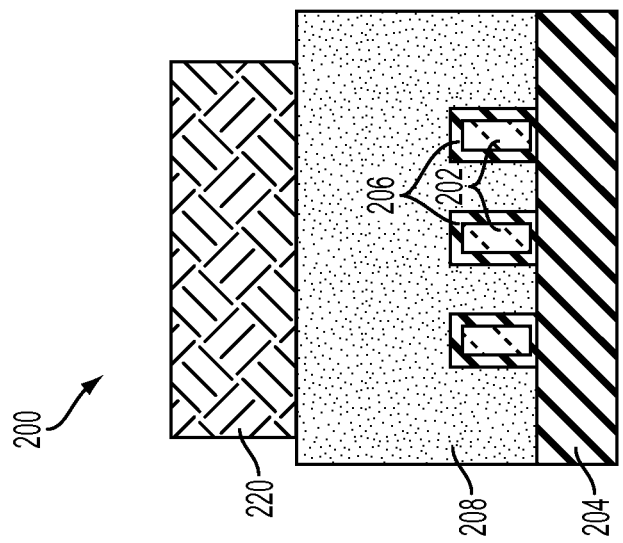
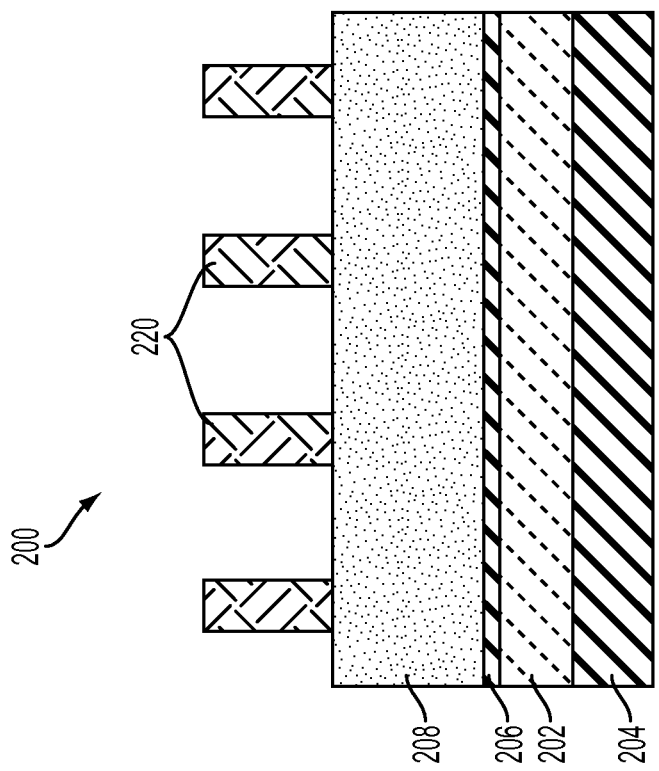

REPLACEMENT METAL GATE INCLUDING DIELECTRIC GATE MATERIAL

DOMESTIC PRIORITY

This application is a divisional of U.S. patent application Ser. No. 14/168,112, filed Jan. 30, 2014, the disclosure of which is incorporated by reference herein in its entirety.

BACKGROUND

The present invention relates to semiconductor device fabrication, and in particular, to a replacement metal gate process.

A replacement metal gate (RMG) process, i.e., a gate last process, has been traditionally used in semiconductor fabrications processes to form a semiconductor device including one or more gate elements 102 that wrap around on one or more semiconductor fins 104. The gate elements 102 typically extend in a direction perpendicular to the direction of the semiconductor fins 104 as illustrated in FIG. 1. The RMG process utilizes a dummy gate element formed from amorphous silicon (a-Si) or polysilicon (PC), which is ultimately replaced with a metal gate element as understood by those ordinarily skilled in the art. However, the silicon material of the dummy gate element may be exposed when recessing the spacers formed on the sidewalls of the dummy gate element. Consequently, epitaxial material may be inadvertently grown on the exposed silicon of the dummy gate element which may result in a short between the epitaxially grown source/drain regions and the epitaxial material grown on the gate element.

SUMMARY

According to at least one embodiment a method of fabricating a semiconductor device comprises forming at least one semiconductor fin on a semiconductor substrate. A plurality of gate formation layers is formed on an etch stop layer that is formed on one or more of the semiconductor fins. The plurality of gate formation layers include a dummy gate layer formed from a dielectric material. The plurality of gate formation layers is patterned to form a plurality of dummy gate elements on the etch stop layer. Each dummy gate element is formed from the dielectric material. A spacer layer formed on the dummy gate elements is etched to form a spacer on each sidewall of dummy gate elements. A portion of the etch stop layer located between each dummy gate element is etched to expose a portion the semiconductor fin. A semiconductor material is epitaxially grown from the exposed portion of the semiconductor fin to form source/drain regions.

According to another exemplary embodiment, a method of fabricating a semiconductor device comprises forming at least one semiconductor fin on a semiconductor substrate. The at least one semiconductor fin includes an etch stop layer formed on an upper surface thereof. The method further comprises forming a plurality of dummy gate elements on the etch stop layer. Each dummy gate element is formed from a dielectric material and has a hardmask gate cap formed on an upper surface thereof. The method further comprises depositing a high-dielectric layer that conforms to an outer surface of each dummy gate element. A spacer layer is deposited on the high-dielectric layer. The method further comprises performing a first etching process that etches the spacer layer to form a spacer on each sidewall of dummy gate elements and exposes an upper portion of the high-dielectric layer. The method further comprises performing a second etching process that is different from the first etching process that selectively etches the upper portion of the high-dielectric layer to expose each hardmask gate cap. The method further comprises removing the hardmask gate caps and the dummy gate elements to form a trench between a respective pair of spacers. The method further comprises performing a third etching process after removing the dummy gates elements to remove a portion of the high-dielectric material from the sidewalls of the spacers such that a remaining portion of the high-dielectric material is interposed between the spacers and the etch stop layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 4A illustrates the substrate of FIGS. 3A-3B according to the first orientation following etching of an optical planar layer and hardmask layer to form individual hardmask gate caps;

FIG. 4B illustrates the substrate of FIG. 4A according to the second orientation;

DETAILED DESCRIPTION

Figure 1:
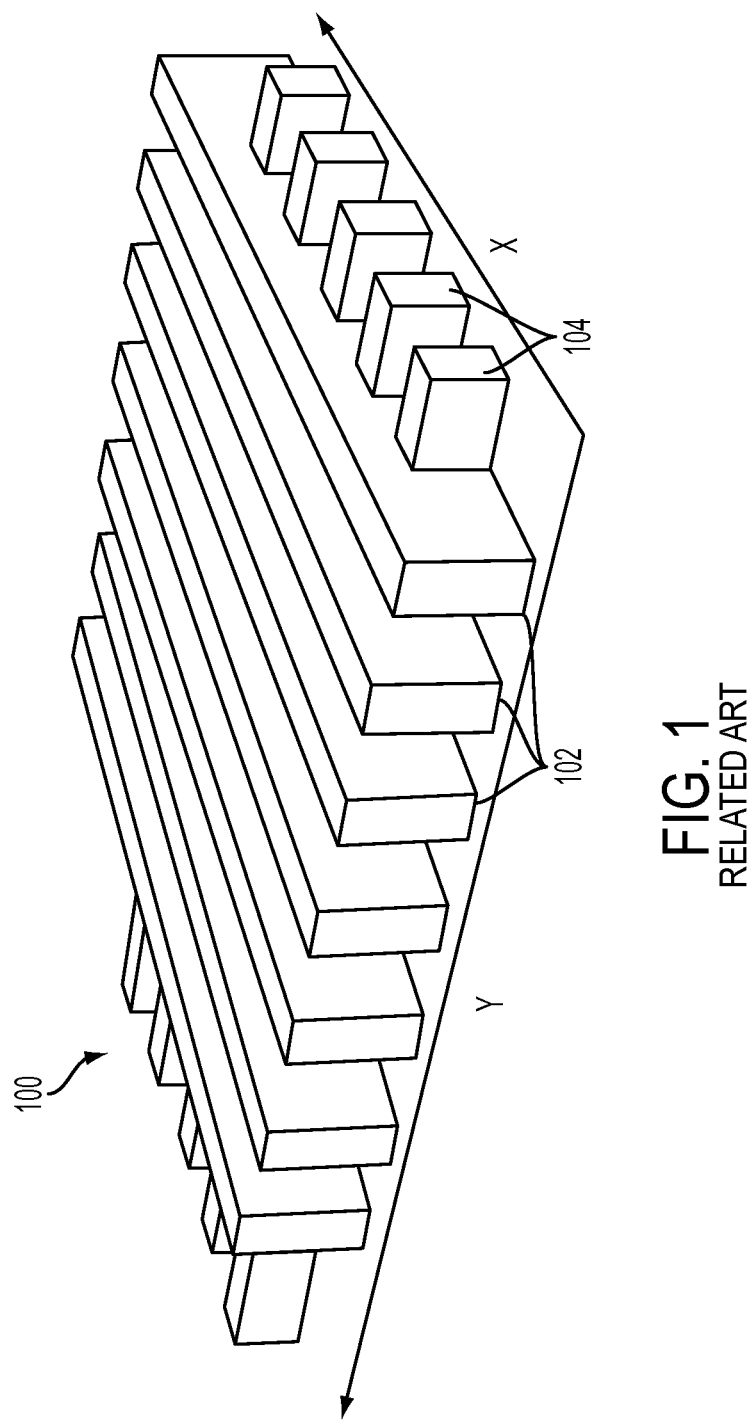
FIG. 1 is an isometric view of a conventional array of semiconductor fins having gate elements formed thereon.
Figure 2B:
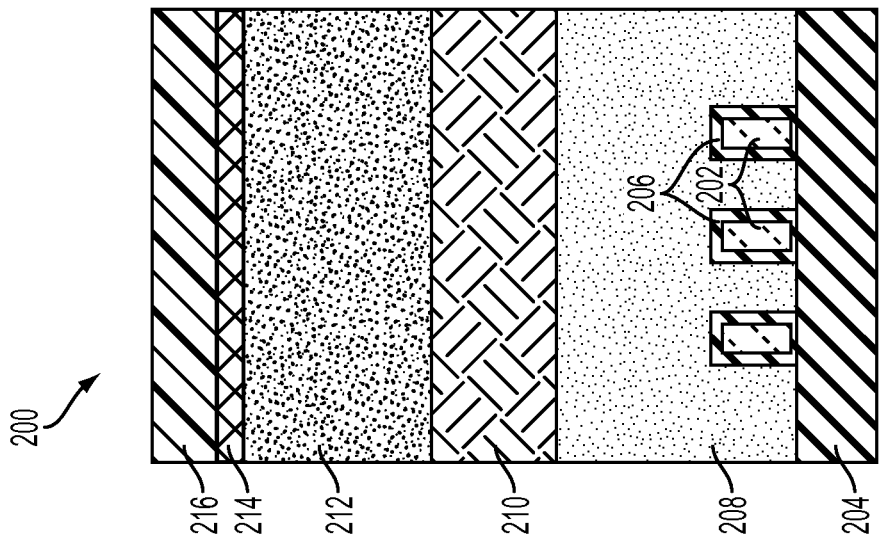
FIG. 2B illustrates the starting substrate of FIG. 2A according to a second orientation showing the gate formation layers formed on a plurality of semiconductor fins and extending along an X-axis to define a width.
Figure 2A:
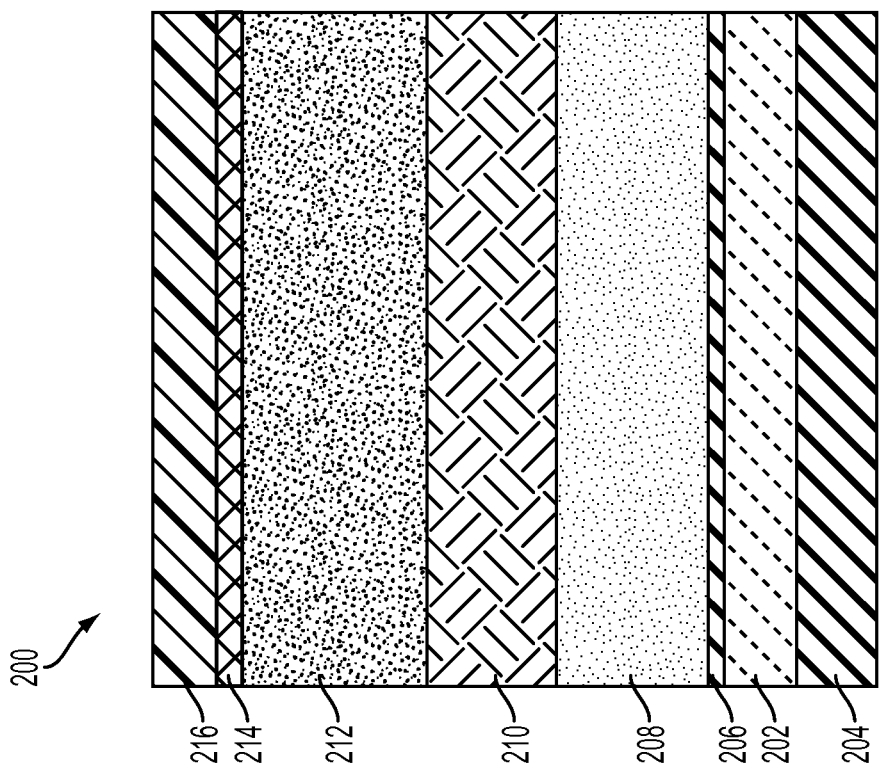
FIG. 2A is block diagram of a starting substrate including a plurality of gate formation layers formed on a semiconductor fin according to a first orientation extending along a Y-axis to define a length.

With reference now to FIGS. 2A-2B, a starting semiconductor substrate 200 including a plurality of gate formation layers formed on one or more semiconductor fins 202 is illustrated according to an exemplary embodiment of the present disclosure. The substrate 200 extends along an X-axis to define a width and a Y-axis to define a length. The semiconductor fins 202 may be formed on a buried oxide (BOX) layer 204 formed on the substrate 200. It is appreciated, however, that the semiconductor fins 202 may be formed on a bulk semiconductor layer of the substrate 200. An etch stop layer 206 may be formed on an upper surface of the semiconductor fins 202. The BOX layer and the etch stop layer may be formed from a dielectric material including, but not limited to, silicon oxide ($SiO_2$). Although a finFET semiconductor device is described going forward, it is appreciated that the inventive teachings described herein may be applied to various other semiconductor topologies including, but not limited to, a planar semiconductor device, and a nanowire semiconductor device.

The gate formation layers are formed on an upper surface of the etch stop layer 206 formed on each semiconductor fin 202. The plurality of gate formation layers include, for example, a dummy gate dielectric layer 208, a gate hardmask layer 210, an optical planar layer (OPL) 212, an anti-reflective coating (ARC) layer 214, and a photoresist layer 216. Although not illustrated, The ARC layer 214 may be replaced with a silicon oxide layer.

The dummy gate dielectric layer 208 may be formed directly on an upper surface of the etch stop layer 206, for example. Unlike a conventional replacement metal gate (RMG) process, the dummy gate dielectric layer 208 is formed from a dielectric material instead of amorphous silicon (Si) or polysilicon (PC). The dummy gate dielectric layer 208 may be formed from various materials including, but not limited to, boron carbide (BC), a silicon boron carbide material that contains nitrogen (i.e., SiB:C(N)), carbon (C), compressed carbon, and $SiO_2$. Therefore, at least one exemplary embodiment of the present disclosure may prevent inadvertent epitaxially growth on exposed portions of the dummy gate element (described below). Accordingly, shorting between epitaxially grown source-drain regions and the dummy gate element may be prevented.

The gate hardmask layer 210 is stacked on the dummy gate dielectric layer 208 and may be formed from various materials including, but not limited to, silicon nitride (SiN) and silicon dioxide ($SiO_2$). The OPL 212 is stacked on the gate hardmask layer 210 to form a planarized upper surface. The OPL 212 may be formed from an organic dielectric layer (ODL) material including, but not limited to, amorphous carbon, CHM701B, commercially available from Cheil Chemical Co., Ltd., HM8006 and HM8014, commercially available from JSR Corporation, and ODL-102, commercially available from ShinEtsu Chemical, Co., Ltd.

The SiARC layer 214 is stacked on the OPL 212 and may comprise Si, for example, to form a silicon-containing ARC (SiARC) layer as described going forward. The photoresist layer 216 may be deposited according to a chemical vapor deposition (CVD) process or an atomic layer deposition (ALD) process as understood by those ordinarily skilled in the art.

Figure 3B:
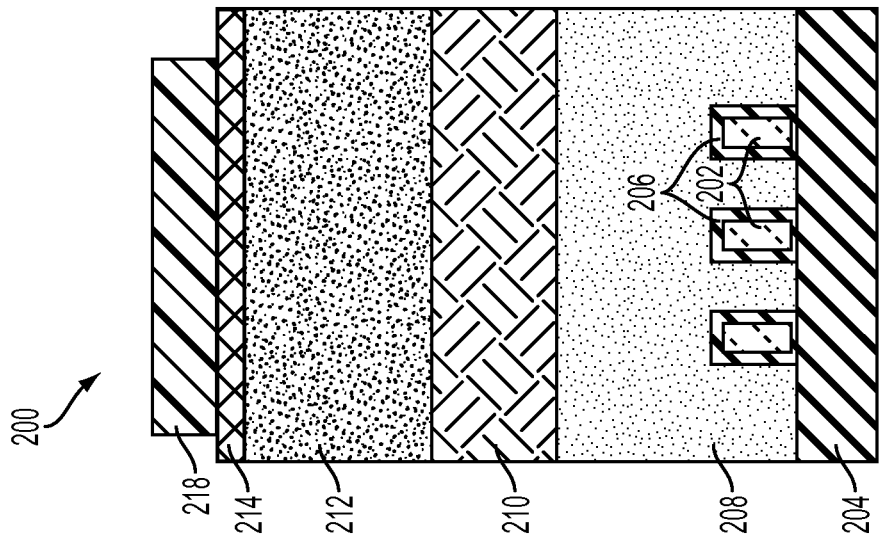
FIG. 3B illustrates the substrate of FIG. 3A according to the second orientation.
Figure 3A:
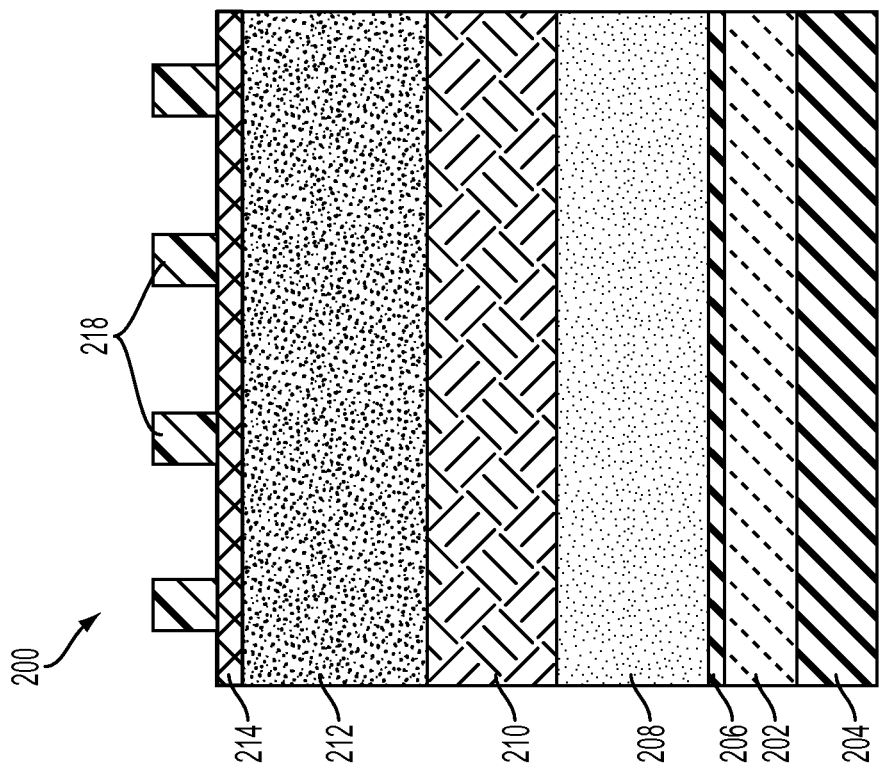
FIG. 3A illustrates the substrate of FIGS. 2A-2B according to the first orientation following patterning of a photoresist layer.

Referring to FIGS. 3A-3B, the photoresist layer 216 is patterned to form one or more individual gate resist elements 218. The gate resist elements 218 ultimately determine the pattern of respective dummy gate elements to be formed on the substrate 200 as understood by those ordinarily skilled in the art. The stacked arrangement of the photoresist layer 216, the SiARC layer 214 and the OPL 212 may form a multilayer element (e.g., a trilateral element) such that a trilayer resist (TLR) patterning scheme may be performed that forms one or more dummy gate elements.

Figure 5B:
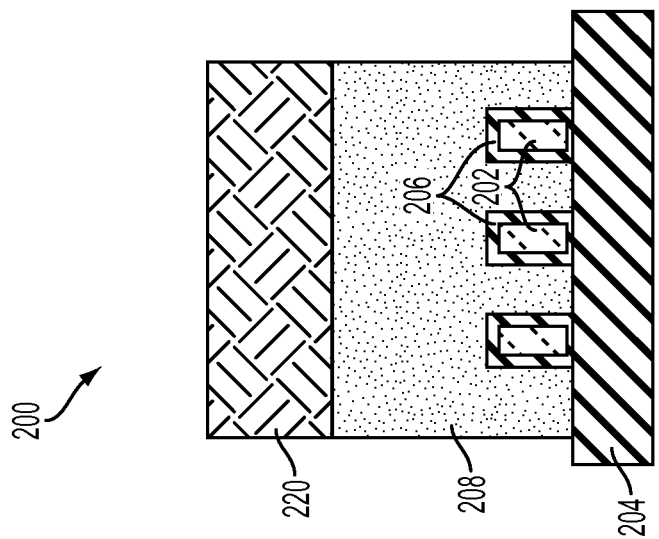
FIG. 5B illustrates the substrate of FIG. 5A according to the second orientation.
Figure 5A:
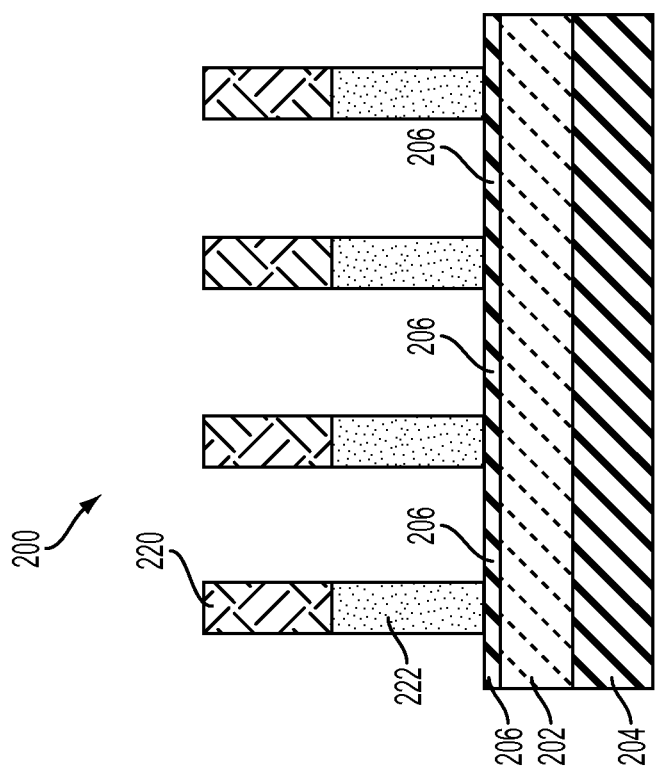
FIG. 5A illustrates the substrate of FIGS. 4A-4B according to the first orientation after etching dummy gate layer according to the patterned hardmask layer to form individual dummy gate elements.

According to at least embodiment, the TLR pattering scheme comprises, for example, patterning the photoresist layer 216 using lithography and trimming, performing first a reactive ion etching (RIE) plasma process to etch through the SiARC layer 214 utilizing the patterned photoresist layer 216 (i.e., the gate resist elements 218) as a first pattern mask where a portion of the photoresist layer 216 is consumed during the during first etching, performing a second etching process to etch the ODL utilizing the patterned SiARC layer 214 as a second pattern mask where the photoresist layer 216 is completely consumed during the second etching, performing a third etching process to remove (e.g., burn-off) the SiARC layer 214, performing a fourth etching process to etch the gate hardmask layer 210 utilizing the etched ODL as a third pattern mask where a portion of the gate hardmask layer 210 is removed during the third etching such that individual hardmask gate caps 220 are formed on the dummy gate dielectric layer 208, and stripping the etched ODL using an RIE or wet cleaning process to form one or more individual hardmask gate caps 220 on the dummy gate dielectric layer 208 as illustrated in FIGS. 4A-4B. Accordingly, the pattern of the photoresist layer 216 may be transferred to the gate hardmask layer 210 for ultimately forming the pattern of dummy gate elements as discussed in greater detail below Referring to FIGS. 5A-5B, the dummy gate dielectric layer 208 is patterned according to the patterned gate hardmask layer 210 (i.e., the hardmask gate caps 220) to form individual dummy gate elements 222. The dummy gate dielectric layer 208 may be etched using a reactive ion etching (RIE) process as understood by those ordinarily skilled in the art. Accordingly, one or more individual dummy gate elements 222 are formed that wrap around one or more semiconductor fins 202.

Figure 6:
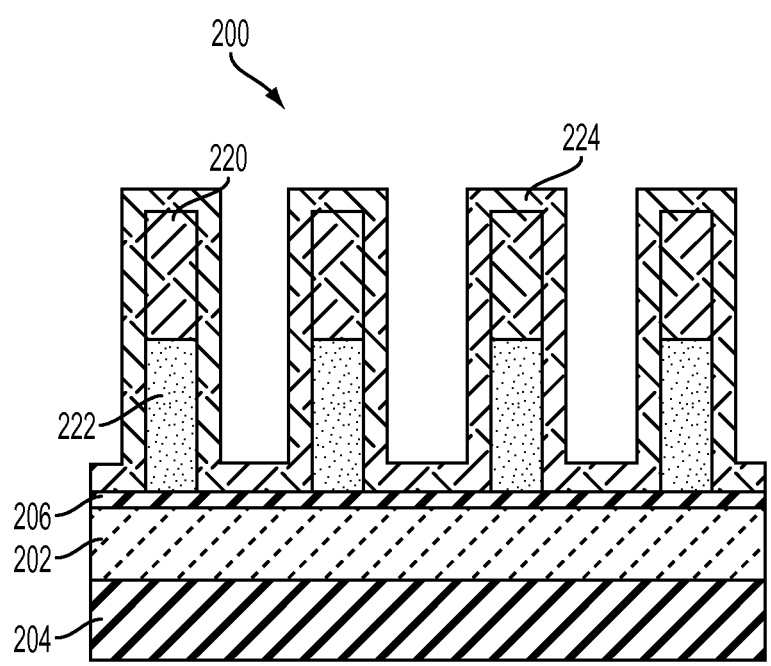
FIG. 6 illustrates the substrate of FIG. 5A following deposition of a conformal spacer layer on sidewalls of the dummy gates elements, gate caps, and on exposed surfaces of the etch stop layer located between each dummy gate element.

Turning now to FIG. 6, a conformal spacer layer 224 is deposited on sidewalls of the dummy gates elements 222, hardmask gate caps 220, and on exposed surfaces of the etch stop layer 206 located between each dummy gate element 222. The conformal spacer layer 224 may be formed from, for example, silicon nitride (SiN).

Figure 7:
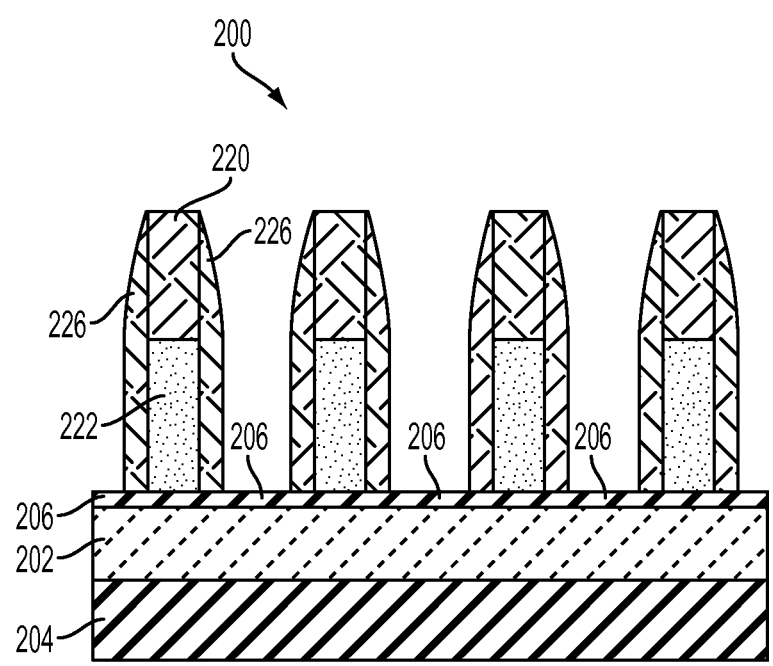
FIG. 7 illustrates the substrate of FIG. 6 following an etching process that partially etches the spacer layer formed on the dummy gate element and that removes the spacer layer formed on the etch stop layer.

Referring to FIG. 7, the spacer layer 224 formed on the dummy gate element 222 is partially etched such that spacers 226 are formed on sidewalls of the dummy gate element 222. Various etching processes may be used to etch the spacer layer 224 including, but not limited to, RIE. A portion of the spacer layer 224 formed on the hardmask gate cap 220 may also be removed such that the underlying gate cap 220 is exposed as further illustrated in FIG. 7.

Figure 8:
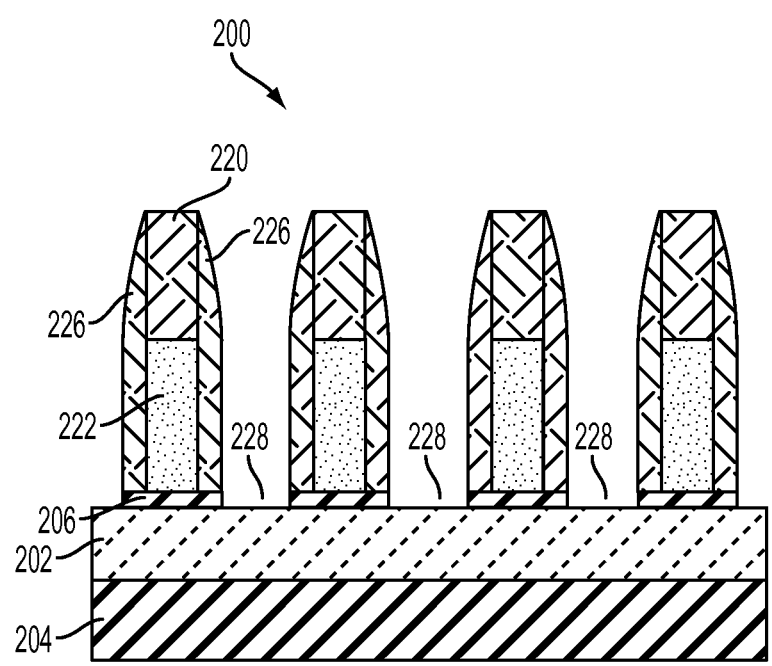
FIG. 8 illustrates the substrate of FIG. 7 following a pre-clean process that removes a portion of the etch stop layer located between each dummy gate element to expose a portion of the underlying semiconductor fin.

Referring to FIG. 8, a pre-clean process is performed that removes a portion of the etch stop layer 206 located between each dummy gate element 222. Accordingly, a cavity 228 is formed between each dummy gate element 222, which exposes a portion of the underlying semiconductor fin 202. The pre-clean process may be performed using a hydrogen fluoride (HF) based wet clean process, or a dry etching process that uses remote plasma that reacts with the etch stop layer 206, while being selective to the spacers 226.

Figure 9:
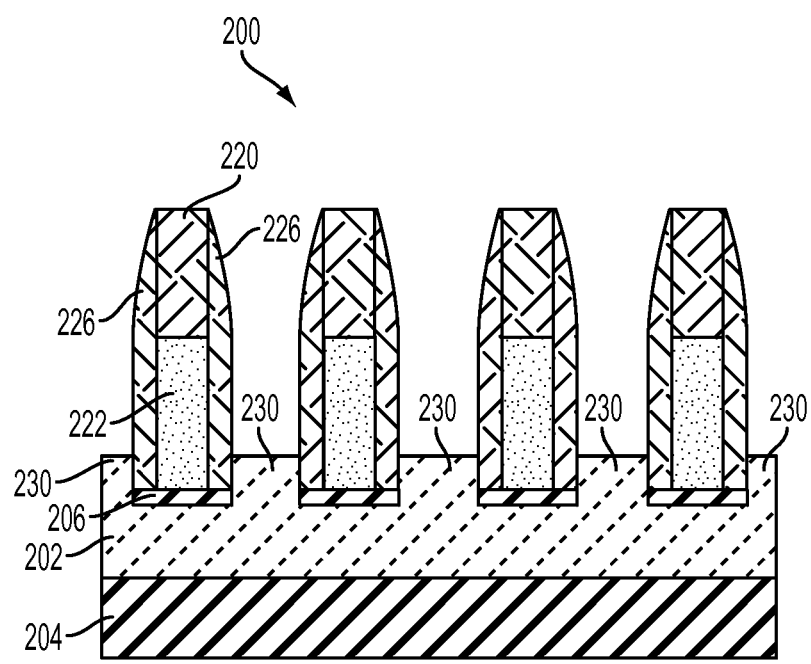
FIG. 9 illustrates the substrate of FIG. 8 following an epitaxial growth process that grows an epitaxial material on the exposed portion of the semiconductor fin located between the dummy gate elements.

Turning now to FIG. 9, an epitaxial growth process is performed that grows an epitaxial semiconductor material 230 on the exposed portion of the semiconductor fin 202 located between the dummy gate elements 222. Well-known processes used to epitaxially grow an epitaxial semiconductor material 230 including, but not limited to, silicon doped with germanium (Ge), carbon (C), and phosphorus (P), or any dopants desired to lower external resistance for forming a source/drain region. The epitaxial semiconductor material 230 may be grown from a portion of the semiconductor fin 202 exposed by a respective cavity 228 and may extend therefrom to contact the sidewalls of a pair of opposing spacers 226 to form one or more source/drain regions.

Figure 10:
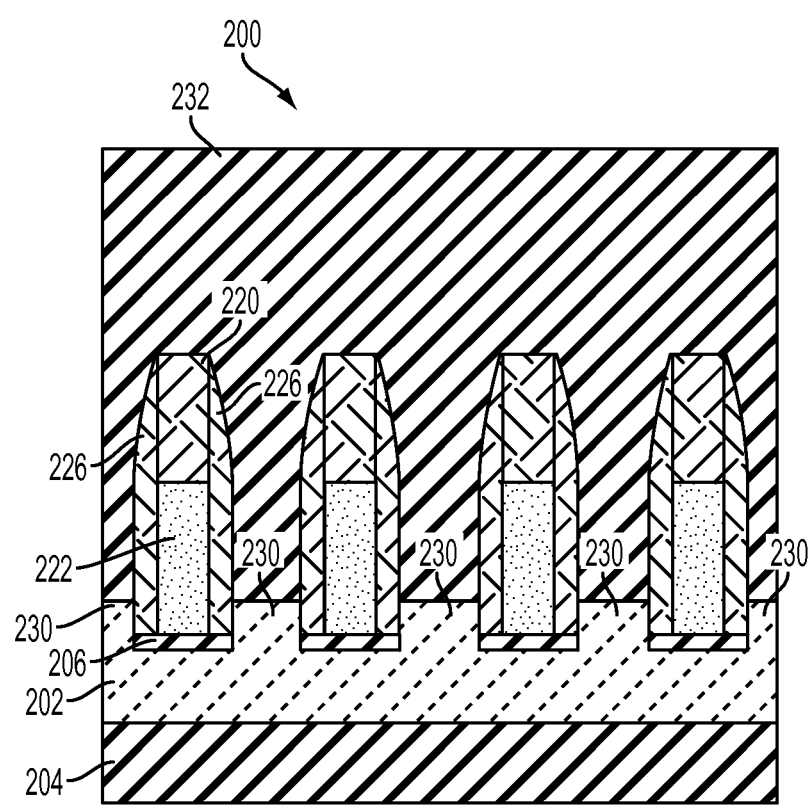
FIG. 10 illustrates the substrate of FIG. 9 following deposition of a block dielectric layer that fills the region between the dummy gate elements and that covers the gate caps.

Referring to FIG. 10, a contact dielectric layer 232 is deposited on the hardmask gate caps 220 and in the voids between the dummy gate elements 222. The contact dielectric layer 232 may also contact one or more source/drain regions of one or more semiconductor fins 202. Various methods may be used to deposit the contact dielectric layer 232 including, but not limited to, chemical vapor deposition (CVD) and atomic layer deposition (ALD). The contact dielectric layer 232 may be formed from various materials including, but not limited to, $SiO_2$.

Figure 11:
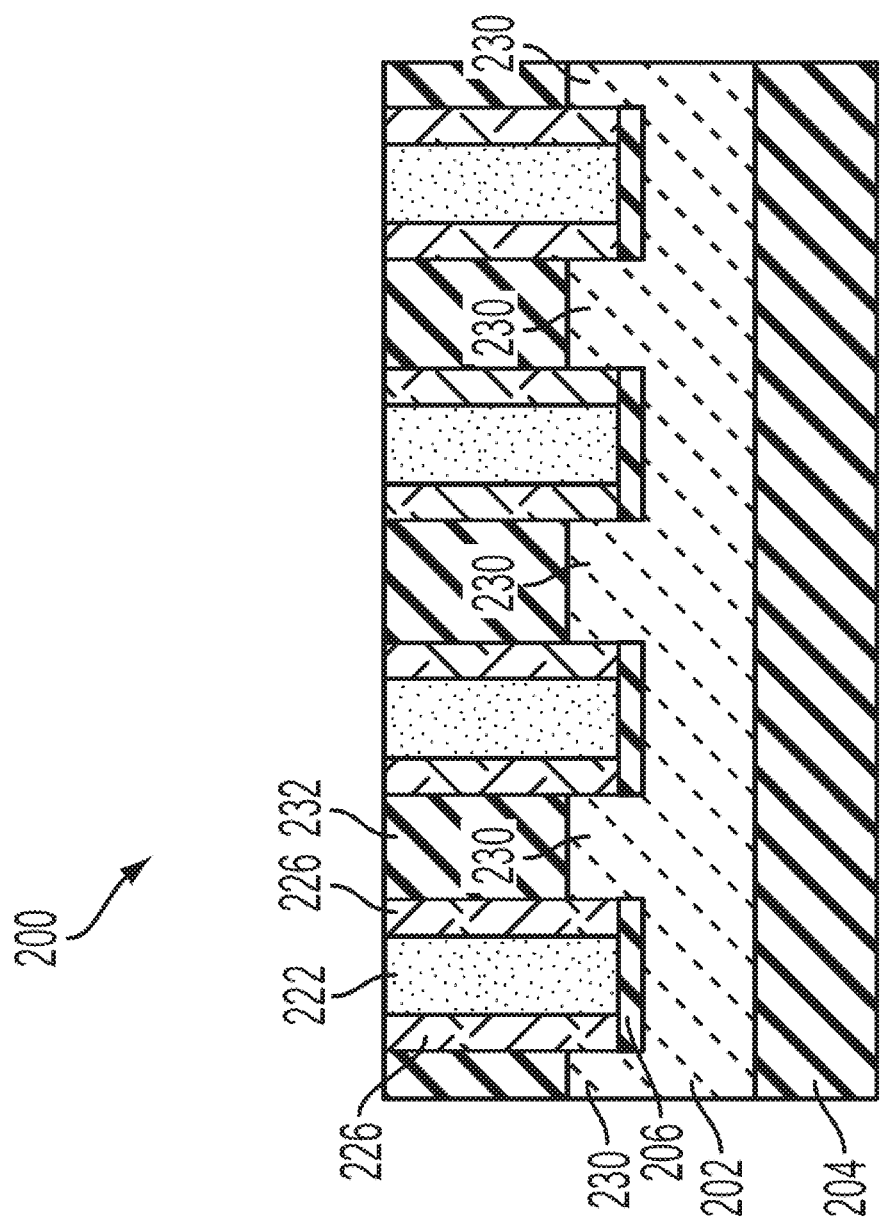
FIG. 11 illustrates the substrate of FIG. 10 following a planarization process that recesses the block dielectric layer and a portion of the spacer layer to expose the dummy gate elements.

Referring now to FIG. 11, a planarization process is performed, which partially recesses the contact dielectric layer 232 and a portion of the spacer layer 224 to expose the dummy gate elements 222. The planarization process may stop on the upper surface of the dummy gate elements 222 such that the upper surface of the contact dielectric layer 232 is flush with the upper surfaces of the dummy gate elements 222.

Figure 12:
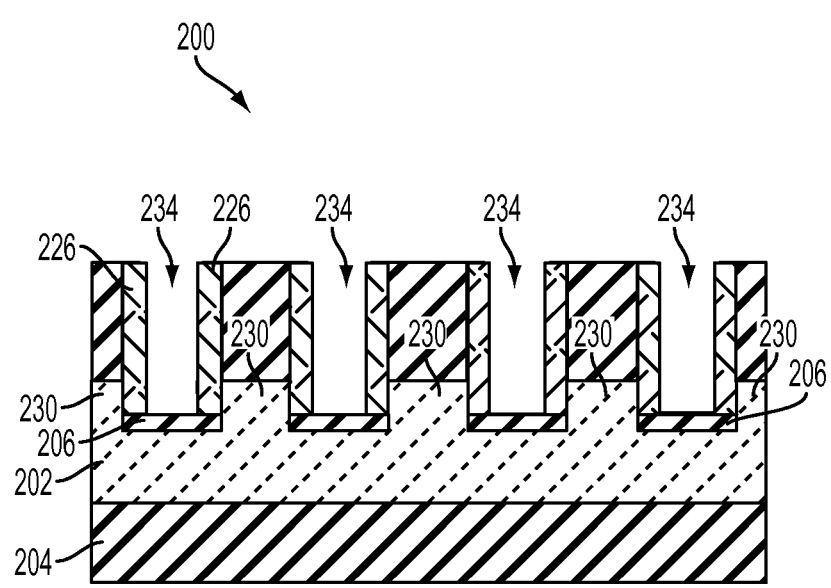
FIG. 12 illustrates the substrate of FIG. 11 following removal of the dummy gate elements to form respective gate trenches.

Turning to FIG. 12, the dummy gate elements 222 are removed according to a replacement metal gate (RMG) process as understood by those ordinarily skilled in the art. For example, the dummy gate elements 222 may be removed using an RIE process or a wet etching process. Accordingly, gate trenches 234 that expose the underlying etch stop layer 206 of the semiconductor fin 202 are formed between a respective pair of spacers 226. According to at least one embodiment, an anneal process may be performed after removing the dummy gate elements 222 to activate the dopants of the source/drain regions. The anneal process may generate a temperature of approximately 900 degrees Celsius (C) or higher, for example.

Figure 13:
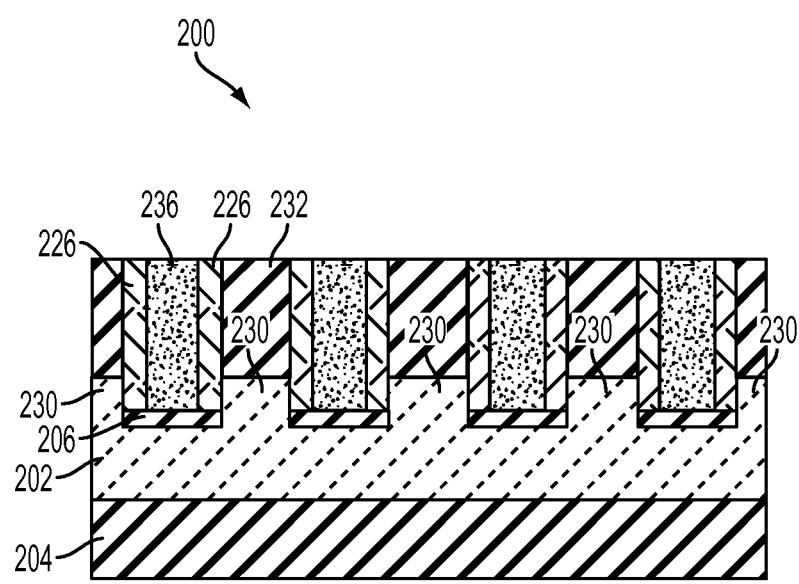
FIG. 13 illustrates the substrate of FIG. 12 following a high-dielectric layer deposition and work function metal filling process that fills the trenches with a gate metal to form respective metal gate elements.

Referring to FIG. 13, a metal filling process is performed that fills the trenches with a gate metal to form respective metal gate elements 236. The gate metal may include various metal materials including, but not limited to, tungsten (W), tantalum (Ta), titanium (Ti), Niobium (Nb), rhenium (Rh), aluminum (Al), tungsten nitride (WN), titanium nitride (TiN) and tantalum nitride (TaN). According to this exemplary embodiment, each metal may contact a respective pair of spacers 226 and a respective etch stop layer 206. In another embodiment, one or more work function metal (WFM) layers may be deposited in the trenches 234 and formed on the sidewalls of the spacers 226 before filling the trenches 234 with the metal gate material. The WFM layer may tune the threshold voltage of a resulting semiconductor device as understood by those ordinarily skilled in the art.

Figure 14:
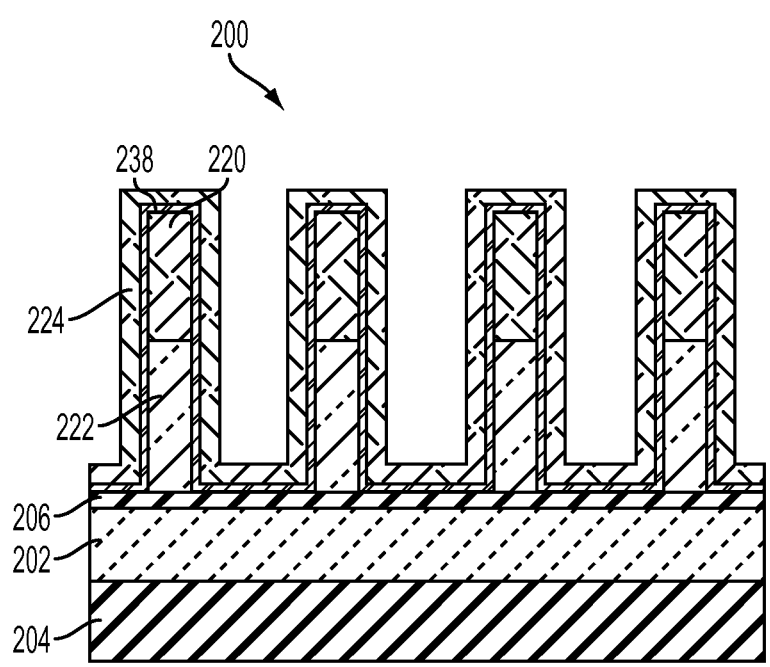
FIG. 14 illustrates another exemplary embodiment of the present disclosure where a conformal high-dielectric layer is deposited on sidewalls of the dummy gates elements, gate caps, and on exposed surfaces of the etch stop layer located between each dummy gate element, and a conformal spacer layer is formed on an upper surface of the high-dielectric layer.

Turning now to FIGS. 14-20, a process flow that interposes a high-dielectric constant layer 238 (i.e., a high-k layer 238) between the spacers 226 and the sidewalls of each dummy gate element 222 is illustrated according to an exemplary embodiment of the present disclosure. In this regard, FIG. 14 illustrates a conformal high-k layer 238 interposed between a conformal spacer layer 224 and the dummy gate elements 222. The conformal high-k layer 238 may first be deposited on sidewalls of the dummy gates elements 222, hardmask gate caps 220, and exposed surfaces of the etch stop layer 206 located between each dummy gate element 222. The high-k layer 238 may be formed from various high-k materials including, but not limited to, hafnium oxide ($HfO_2$). The conformal spacer layer 224 may then be formed on an upper surface of the high-k layer 238. The conformal spacer layer 224 may be formed from, for example, SiN.

Figure 15:
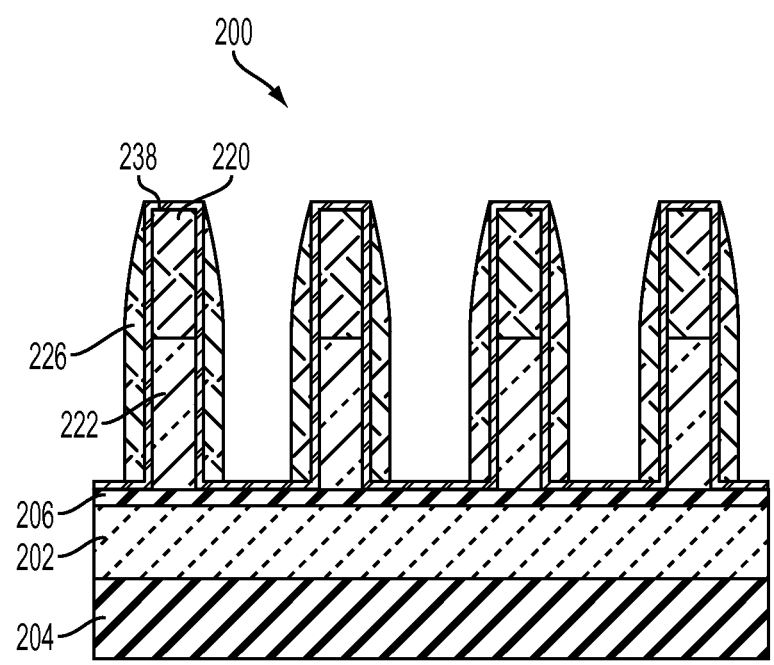
FIG. 15 illustrates the substrate of FIG. 14 following an etching process that partially removes the spacer layer formed on the etch stop layer and that etches the spacer layer formed on the dummy gate element to expose an upper portion of the high-dielectric layer.

Referring to FIG. 15, an etching process is performed that partially removes the spacer layer 224 formed on the etch stop layer 206 and that etches the spacer layer 224 formed on the dummy gate element 222. Accordingly, an upper portion of the high-k layer 238 is exposed.

Figure 16:
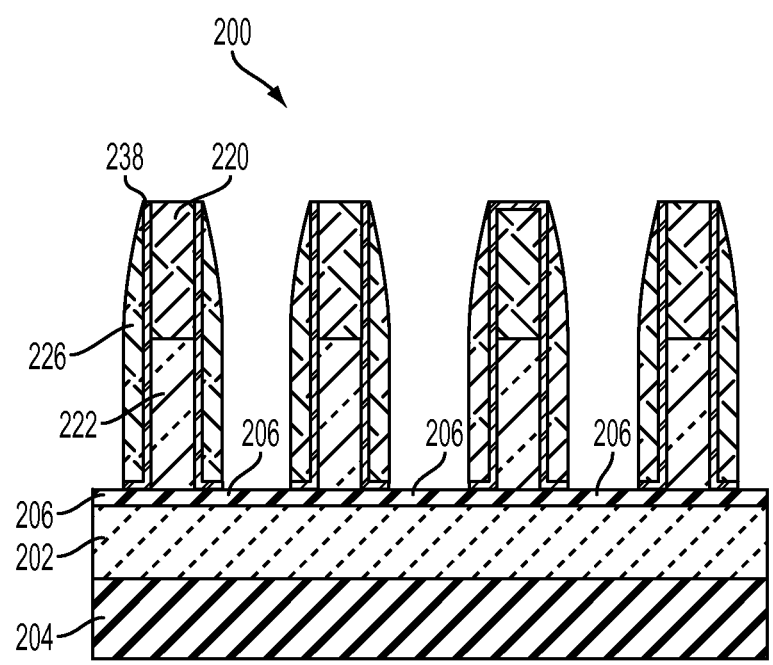
FIG. 16 illustrates the substrate of FIG. 15 following an etching process that removes an upper portion of the high-dielectric layer.

Referring to FIG. 16, a second etching process, such as a carina etch for example, is performed that removes the exposed upper portion of the high-k layer 238. The carina etch is selective to the spacer layer 224 such that the high-k layer 238 is removed while the spacer layer 224 is maintained. Accordingly, an upper portion of the underlying hardmask gate cap 220 is exposed.

Figure 17:
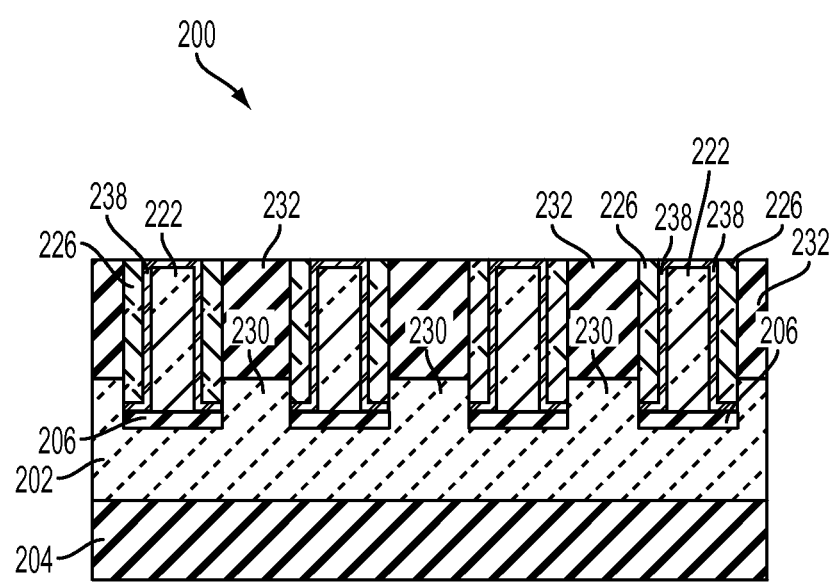
FIG. 17 illustrates the substrate of FIG. 16 following a planarization process that recesses a block dielectric layer and gate caps to expose the dummy gate elements.

Referring to FIG. 17, a planarization process that partially recesses a contact dielectric layer 232 is performed which exposes an upper portion of the dummy gate elements 222. The contact dielectric layer 232 is formed as previously discussed above. The planarization process may stop on the upper surface of the dummy gate elements 222 such that the upper surface of the contact dielectric layer 232 is flush with the upper surfaces of the dummy gate elements 222.

Figure 18:
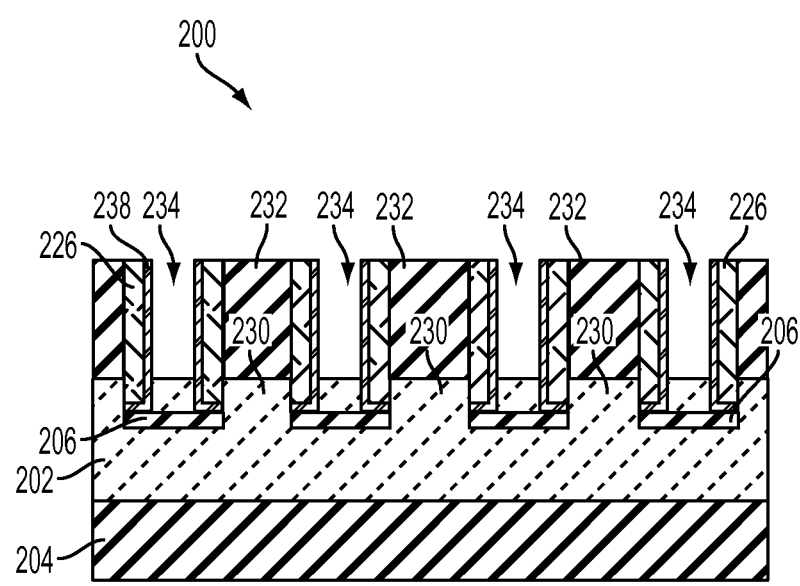
FIG. 18 illustrates the substrate of FIG. 17 following removal of the dummy gate elements to form respective gate trenches and to expose the high-dielectric layer formed on sidewalls of the trenches.

Referring now to FIG. 18, the dummy gate elements 222 are removed according to a replacement metal gate (RMG) process as understood by those ordinarily skilled in the art. For example, an RIE process or a wet etching process may be used to remove the dummy gate elements 222. Accordingly, gate trenches 234 are formed that expose portions of the underlying etch stop layer 206 located between the remaining high-k layer 238 formed on sidewalls of the spacers 226.

Figure 19:
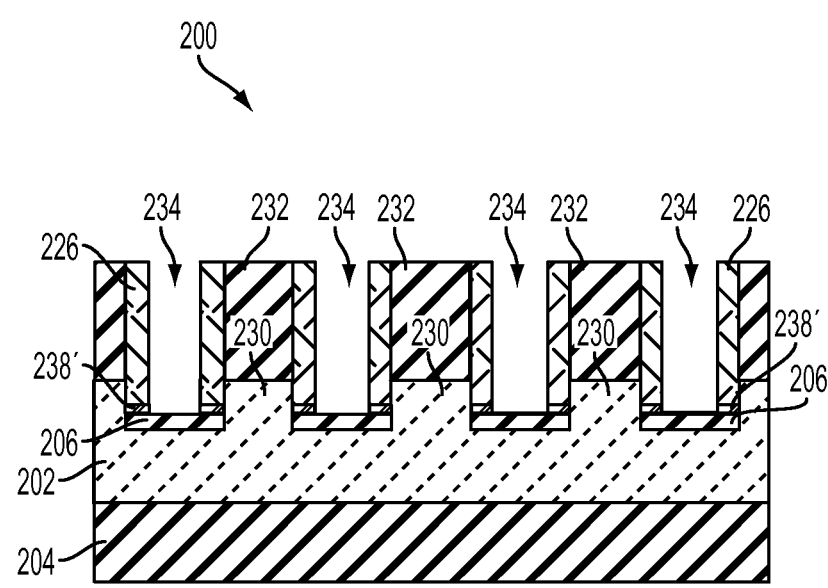
FIG. 19 illustrates the substrate of FIG. 18 following an etching process that removes the high-dielectric layer formed on sidewalls of the trenches.

Referring to FIG. 19, an etching process is performed that removes portions of the high-k layer 238 from the sidewalls of the spacers 226 such that the length of each trench 234 increases. Various etchings process may be used to remove the high-k layer 238 including, but not limited to, a carina etch. As illustrated in FIG. 19, for example, a portion of the high-k layer 238' may be maintained between the spacer 226 and the etch stop layer 206, while the trench 234 exposes a portion of the etch stop layer 206 located between the spacers 226. Although not illustrated, at least one exemplary embodiment of the present teachings utilizes the high-k layer 238 as a gate oxide layer. In this regard, the properties of the high-k layer 238 may change during the dummy gate pull process to affect work function properties. For purpose of gate work function control, the high-k layer 238 may be best used as a sacrificial layer and may be omitted at FIG. 19, and deposited as a high-k gate oxide layer before performing a metal filling process described below. Accordingly, process of removing portions of the high-k layer 238 from the sidewalls is optional and may be skipped at this stage of the exemplary process flow.

Figure 20:
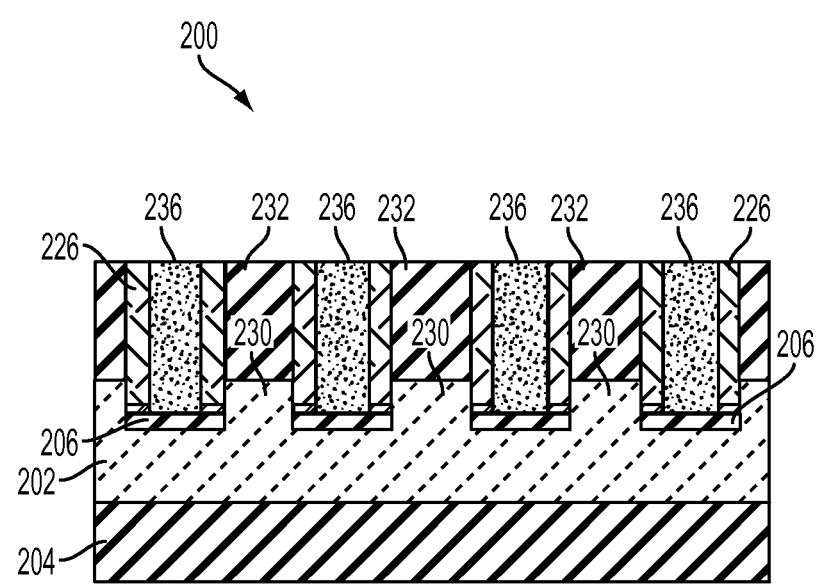
FIG. 20 illustrates the substrate of FIG. 19 following a high-dielectric layer deposition and work function metal filling process that fills the trenches with a gate metal to form respective metal gate elements.

Turning now to FIG. 20, a metal filling process is performed that fills the trenches 234 with a gate metal to form respective metal gate elements 236. The gate metal may include various metal materials including, but not limited to, tungsten (W), tantalum (Ta), titanium (Ti), Niobium (Nb), rhenium (Rh), aluminum (Al), tungsten nitride (WN), titanium nitride (TiN) and tantalum nitride (TaN). According to this exemplary embodiment, the metal gate elements 236 may contact the spacers 226, the remaining high-k material, and the etch stop layer 206. As discussed above, a high-k layer 238 for forming a gate oxide layer may be deposited in the trenches 234 before depositing the gate metal in the trenches 234.

Figure 21:
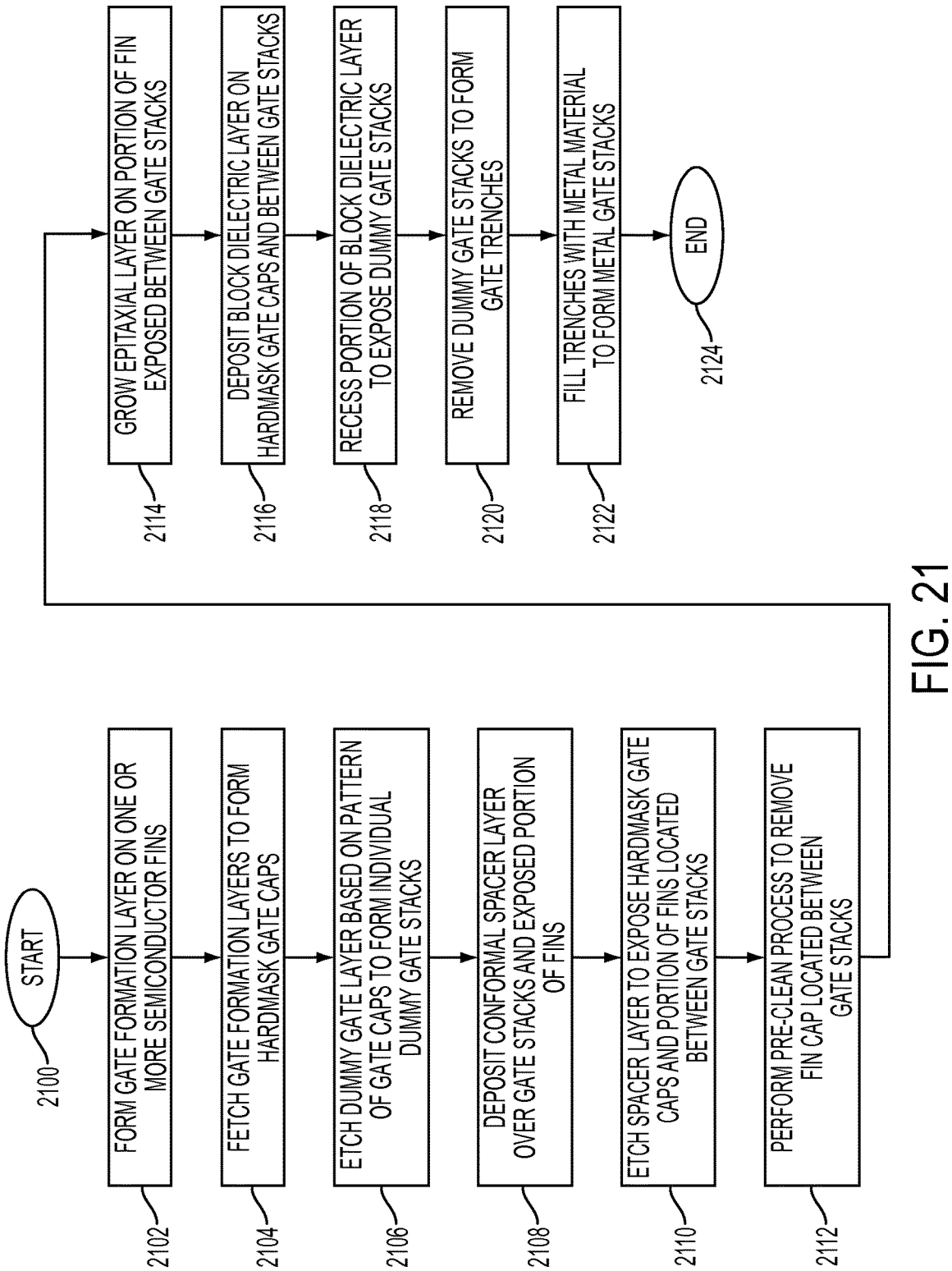
FIG. 21 is a flow diagram illustrating a method of fabricating a semiconductor device according to an exemplary embodiment of the present disclosure.

FIG. 21 is a flow diagram illustrating a method of fabricating a semiconductor device according to an exemplary embodiment of the present disclosure. The method begins at operation 2100, and proceeds to operation 2102 where a plurality of gate formation layers are formed on one or more semiconductor fins. The semiconductor fins are formed on a semiconductor substrate as understood by those ordinarily skilled in the art. At operation 2104, the plurality of gate formation layers are etched such that a one or more hardmask gate caps are patterned atop a dummy gate dielectric layer. A trilayer resist (TLR) patterning scheme may be used to etch the gate formation layer, for example. At operation 2106, the dummy gate dielectric layer is etched to form one or more dummy gate elements having a respective hardmask gate cap formed on an upper surface thereof. The pattern of the one or more gate elements may be based on a pattern of the one or more hardmask gate caps previously formed atop the dummy gate dielectric layer. At operation 2108, a conformal spacer layer is deposited on sidewalls of the dummy gates elements, the gate caps, and on the exposed surfaces of the etch stop layer located between each dummy gate element. According to another exemplary embodiment, a conformal high-k layer may be deposited on sidewalls of the dummy gates elements, the gate caps, and on the exposed surfaces of the etch stop layer located between each dummy gate element. Thereafter, the conformal spacer layer is deposited on top of the high-k layer. In this regard, the high-k layer is interposed between the dummy gate elements and the spacer layer.

Turning to operation 2110, the spacer layer formed on the dummy gate element is partially etched such that the spacers are formed on the sidewalls of the dummy gate element and a portion of the underlying gate cap is exposed. At operation 2112, a pre-clean process is performed that removes a portion of the etch stop layer located between each dummy gate element. Accordingly, a portion of the underlying semiconductor fin located between each dummy gate element is exposed. At operation 2114, an epitaxial material is grown on the exposed portion of the semiconductor fin located between the dummy gate elements. At operation 2116, a contact dielectric layer is deposited on the gate caps and in the voids between the dummy gate elements. At operation 2118, a portion of contact dielectric layer and a portion of the spacers are recessed using, for example, a chemical mechanical planarization (CMP) process. The planarization process may stop on the upper surface of the dummy gate elements such that the upper surface of the contact dielectric layer is flush with the upper surfaces of the dummy gate elements. At operation 2120, the dummy gate elements are removed according to a replacement metal gate (RMG) process as understood by those ordinarily skilled in the art. For example, a wet etching process or RIE process may be used to remove the dummy gate elements. Accordingly, gate trenches that expose the underlying etch stop layer are formed between a respective pair of spacers. At operation 2122, the trenches are filled with a metal gate material to form respective metal gate elements, and the method ends at operation 2124.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
    forming at least one semiconductor fin on a semiconductor substrate;
    forming an etch stop layer on an upper surface of the at least one semiconductor fin;
    forming a plurality of dummy gate elements on the etch stop layer such that the etch stop layer is located between the at least one semiconductor fin and each dummy gate element among the plurality of dummy gate elements, each dummy gate element formed from a dielectric material selected from a group comprising of boron carbide (BC), carbon (C), silicon dioxide (SiO$_2$), and a silicon boron carbide material that contains nitrogen (SiB:C(N)), and each dummy gate element having a hardmask gate cap formed atop the dielectric material;
    depositing a high-dielectric constant layer directly against an outer surface of each dummy gate element and depositing a spacer layer on the high-dielectric constant layer;
    performing a first etching process that etches the spacer layer to form a spacer on each sidewall of dummy gate elements and exposes an upper portion of the high-dielectric constant layer;
    performing a pre-clean process that removes a portion of the etch stop layer located between each dummy gate element so as to form a cavity that exposes a portion of the at least one semiconductor fin between each dummy gate element;
    performing an epitaxial growth process that grows an epitaxial semiconductor material on the exposed portion of the at least one semiconductor fin between each dummy gate element;
    performing a second etching process different from the first etching process that selectively etches the upper portion of the high-dielectric constant layer to expose each hardmask gate cap;
    depositing a contact dielectric layer that fills a void between the spacers, and covers an outer surface of the spacers and an upper portion of the dummy gate elements;
    performing a planarization process selective to one of boron carbide (BC), carbon (C), silicon dioxide (SiO$_2$), and a silicon boron carbide material that contains nitrogen (SiB:C(N)) such that the dummy gate element is used as an etch stop element so as to remove the hardmask gate caps and form an upper surface of the contact dielectric layer flush with an upper surface of each spacer and an upper surface of each dummy gate element;
    removing the dummy gate elements to form a trench between a respective pair of spacers; and
    performing a third etching process after removing the dummy gates elements to remove a portion of the high-dielectric constant material from the sidewalls of the spacers such that a remaining portion of the high-dielectric constant material is interposed between the spacers and the etch stop layer; and
    depositing a gate material in the trenches to form a metal gate element that contacts the spacers, the remaining portion of high-dielectric constant material and the etch stop layer.

* * * * *